US011139776B2

(12) United States Patent
Bunea et al.

(10) Patent No.: US 11,139,776 B2
(45) Date of Patent: Oct. 5, 2021

(54) PHOTOVOLTAIC PANEL HAVING A DISTRIBUTED SUPPORT FRAME

(71) Applicant: Sunpower Corporation, San Jose, CA (US)

(72) Inventors: Gabriela Elena Bunea, San Jose, CA (US); Lee Gorny, Mountain View, CA (US); George Nadim Mseis, Berkeley, CA (US)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 178 days.

(21) Appl. No.: 15/201,073

(22) Filed: Jul. 1, 2016

(65) Prior Publication Data

US 2018/0006599 A1    Jan. 4, 2018

(51) Int. Cl.
*H01L 31/048* (2014.01)
*H02S 20/30* (2014.01)
*H02S 30/10* (2014.01)
*H02S 20/26* (2014.01)
*H01L 31/049* (2014.01)

(52) U.S. Cl.
CPC .......... *H02S 30/10* (2014.12); *H01L 31/048* (2013.01); *H01L 31/049* (2014.12); *H01L 31/0481* (2013.01); *H02S 20/26* (2014.12); *H02S 20/30* (2014.12); *Y02E 10/50* (2013.01)

(58) Field of Classification Search
CPC ..... H02S 30/10; H01L 31/048; H01L 31/049; H01L 31/0481
See application file for complete search history.

(56) References Cited

U.S. PATENT DOCUMENTS

| 4,611,090 A * | 9/1986 | Catella .................. H01L 31/048 |
| | | 136/251 |
| 2010/0132766 A1 | 6/2010 | Jenkins |
| 2012/0048349 A1 | 3/2012 | Metin et al. |
| 2013/0193301 A1* | 8/2013 | Jackson .................. F24S 25/50 |
| | | 248/676 |
| 2014/0060649 A1 | 3/2014 | Stassen |

(Continued)

FOREIGN PATENT DOCUMENTS

| CN | 85109335 | 7/1986 |
| CN | 103688115 | 3/2014 |

(Continued)

OTHER PUBLICATIONS

Definition of "Tapering" as provided by Google, Accessed on on Mar. 10, 2020.*

(Continued)

*Primary Examiner* — Golam Mowla
(74) *Attorney, Agent, or Firm* — Grasso PLLC

(57) ABSTRACT

A photovoltaic panel having a photovoltaic module supported by a distributed support frame is described. The distributed support frame may include a support member extending over a back surface of the photovoltaic module. For example, one or more support members may extend laterally from a support hub mounted on the back surface. The distributed support frame may reduce a span length of the photovoltaic module between support locations, and thus, may reduce a likelihood that a module laminate will crack under a design load.

20 Claims, 8 Drawing Sheets

(56) References Cited

U.S. PATENT DOCUMENTS

2014/0117190 A1* 5/2014 Werner .................. E04C 3/09
   248/346.03
2014/0196767 A1* 7/2014 Houle .................. H02S 30/00
   136/251

FOREIGN PATENT DOCUMENTS

| DE | 102009035644 A1 | 7/2009 |
| FR | 2922365 | 4/2009 |
| WO | 2008136095 A1 | 11/2008 |
| WO | 2008139609 A1 | 11/2008 |
| WO | WO 2010/130952 | 11/2010 |
| WO | 2011141293 A1 | 11/2011 |
| WO | WO 2011/141293 | 11/2011 |

OTHER PUBLICATIONS

International Preliminary Report on Patentability from PCT/US2017/039809 dated Jan. 10, 2019, 2 pgs.
International Search Report and Written Opinion from PCT/US2017/039809 dated Oct. 11, 2017 14 pgs.
Extended European Search Report from European Patent Application No. 17 821 177.7; dated Jul. 2, 2019; 10 pgs.
First Office Action from Chinese Patent Application No. 2017800379861 dated Nov. 18, 2019, 12 pgs.
Second Office Action from Chinese Patent Application No. 2017800379861 dated Nov. 11, 2020.
Google Machine Translation of Second Office Action from Chinese Patent Application No. 2017800379861 dated Nov. 11, 2020.
Third Office Action from Chinese Patent Application No. 2017800379861 dated May 26, 2021.
Google Machine Translation of Third Office Action from Chinese Patent Application No. 2017800379861 dated May 26, 2021.
Reasons for Refusal from Japanese Patent Application No. 2018-563596 dated May 24, 2021.
Translation of Reasons for Refusal from Japanese Patent Application No. 2018-563596 dated May 24, 2021.

* cited by examiner

A-A

US 11,139,776 B2

PHOTOVOLTAIC PANEL HAVING A DISTRIBUTED SUPPORT FRAME

BACKGROUND

Photovoltaic (PV) cells, commonly known as solar cells, are well known devices for converting solar radiation into electrical energy. Generally, solar cells are fabricated on a semiconductor wafer or substrate using semiconductor processing techniques to form a p-n junction near a surface of the substrate. Solar radiation impinging on the surface of the substrate creates electron and hole pairs in the bulk of the substrate, which migrate to p-doped and n-doped regions in the substrate, thereby generating a voltage differential between the doped regions. The doped regions are coupled to metal contacts on the solar cell to direct an electrical current from the cell to an external circuit coupled thereto. Generally, an array of solar cells, each solar cell interconnected, is mounted on a common or shared platform to provide a photovoltaic module. A photovoltaic module may be composed of a photovoltaic laminate. A plurality of photovoltaic modules or module groups may be electrically coupled to an electrical power distribution network, forming a photovoltaic system.

DETAILED DESCRIPTION

Figure 1:
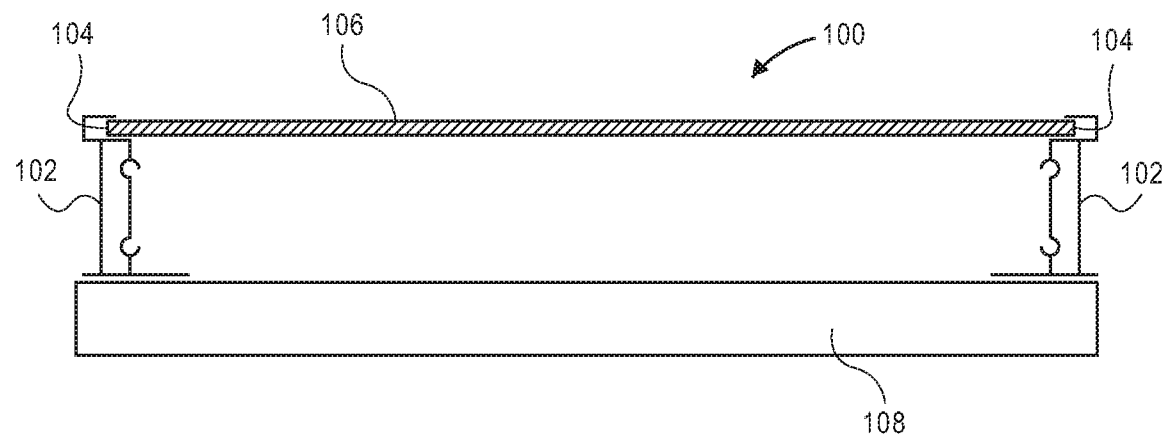
FIG. 1 illustrates a photovoltaic panel having a photovoltaic module supported along an outer edge.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" edge does not necessarily imply that this edge is the first edge in a sequence; instead the term "first" is used to differentiate this edge from another edge (e.g., a "second" edge).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper," "lower," "above," "below," "in front of," and "behind" refer to directions in the drawings to which reference is made. Terms such as "front," "back," "rear," "side," "outboard," "inboard," "leftward," and "rightward" describe the orientation and/or location of portions of a component, or describe the relative orientation and/or location between components, within a consistent but arbitrary frame of reference which is made clear by reference to the text and the associated drawings describing the component(s) under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

PV modules may include a module laminate having a PV cell encapsulated between a front sheet and a back sheet. For example, PV cells are typically encapsulated between a front glass sheet and a back glass sheet. A support frame is typically attached to an outer edge of the PV module to form a PV panel. The support frame supports the PV module along the outer edge. Thus, when an external load, e.g., a wind or snow load, presses downward on the front glass sheet, the entire external load is countered by an upward reaction force along the outer edge.

Referring to FIG. 1, a photovoltaic panel having a photovoltaic module supported along an outer edge is illustrated. Existing photovoltaic (PV) panels include support frames 102 supporting a PV module 106 along an outer edge 104. Support frames 102 may be mounted on an external structure 108, e.g., a rooftop. Thus, when environmental loading is applied to the PV module 106, e.g., by pressing downward on PV module 106, external structure 108 transmits an upward reactive force through support frames 102 to outer edges 104. Accordingly, the environmental load is counteracted by a reactive force distributed along outer edges 104, and PV module 106 between outer edges acts like an end-supported beam. That is, PV module 106 sags under the downward force applied by the environmental loading.

Figure 2:
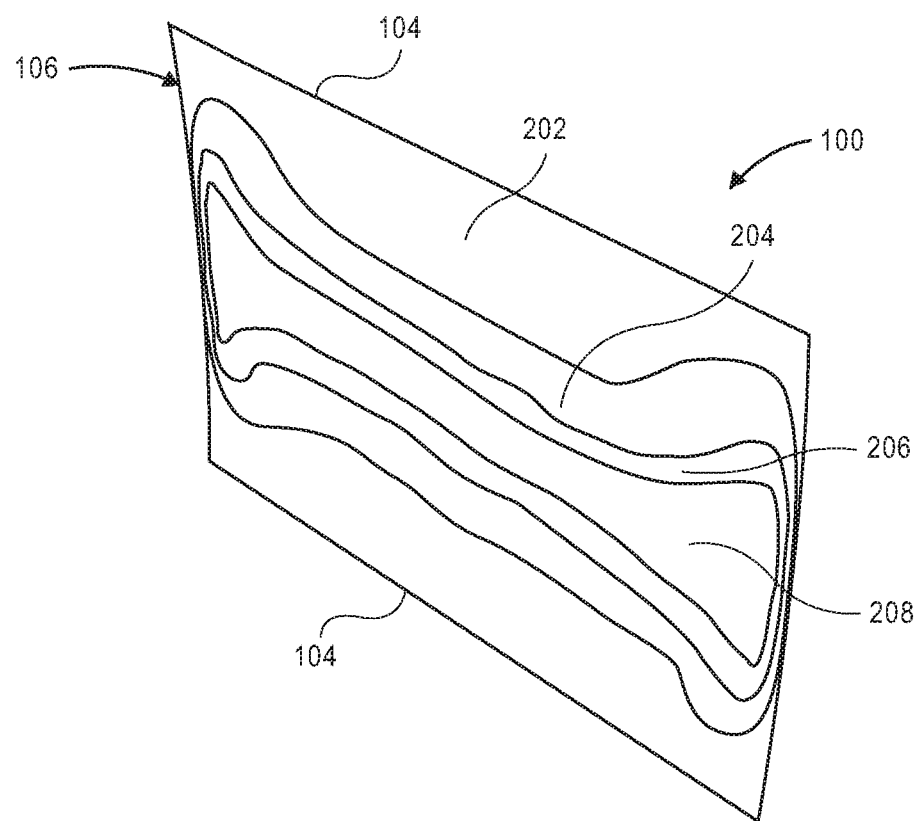
FIG. 2 illustrates a deflection distribution of a photovoltaic panel having a photovoltaic module supported along an outer edge.

Referring to FIG. 2, a deflection distribution of a photovoltaic panel having a photovoltaic module supported along an outer edge 104 is illustrated. When external loading is applied to PV panel 100, PV module 106 bows between opposite outer edges 104. More particularly, PV module 106 may deflect to varying degrees between the supports at outer edges 104. For example, PV module 106 may have a support deflection 202, which is an area of minimum deflection, near outer edges 104. Further from outer edges 104, PV module 106 may have a design deflection 204. Design deflection 204 may be a deflection having a predetermined factor of safety compared to a maximum deflection 206 that PV module 106 may experience prior to cracking. At locations even further from outer edges 104, PV module 106 may have maximum deflection 206. Maximum deflection 206 may be a deflection at which cracking is statistically likely to occur in PV module 106. Maximum deflection 206 may correspond to a design load pressing on PV module 106. By way of example, the design load may be a 6000 Pascal pressure across a face of PV module 106. Design load may correspond to a uniform snowfall. Real-world loading may, however, differ from the design load, and thus, PV module 106 may deflect to an over deflection 208 at one or more locations between outer edges 104. Over deflection 208 may be a deflection at which cracking occurs in PV module 106.

PV module 106 may include a glass-glass laminate having a thickness sufficient to resist cracking under environmental loading. For example, to reduce the likelihood of over deflection 208 in PV module 106, the glass-glass laminate may be formed with glass sheets having thicknesses greater than 3 mm. Such PV modules 106, however, can be costly both to manufacture and to ship to an installation site. Furthermore, glass-glass laminate modules can be particularly difficult to install because handling damage may be more likely to occur. Thus, a lighter PV panel capable of resisting cracking under environmental loading, can provide an improvement over the state of the art.

In an aspect, a PV panel includes a distributed support frame having a support member extending over a back surface of a PV module is provided. More particularly, a PV panel may include a PV module having a front glass sheet and a rear polymer sheet that is less costly to manufacture and ship, as compared to a glass-glass laminate. Furthermore, the PV panel may include a distributed support frame to support the PV module across a back surface of the rear polymer sheet. Thus, even when the PV laminate is more flexible than a glass-glass laminate, the PV module may deflect less under external loading because the external loading may be distributed across a width of the PV module. Accordingly, a support span may be reduced as compared to the support span between opposite outer edges, and the module deflection may reduce correspondingly. Accordingly, the PV cells within the PV module supported across a back surface may be less susceptible to cracking.

The aspects described above may be realized by the PV panel having a PV module supported by a distributed support frame as disclosed herein. In the following description, numerous specific details are set forth, such as specific material regimes and component structures, in order to provide a thorough understanding of embodiments of the present disclosure. It will be apparent to one skilled in the art that embodiments of the present disclosure may be practiced without these specific details. In other instances, well-known fabrication techniques or component structures, such as specific types of mechanical couplers or techniques for laminating PV module components, are not described in detail in order to not unnecessarily obscure embodiments of the present disclosure. Furthermore, it is to be understood that the various embodiments shown in the figures are illustrative representations and are not necessarily drawn to scale.

By way of summary, disclosed herein is a PV panel having a PV module supported by a distributed support frame. In an embodiment, the PV module may have a laminate structure, e.g., a PV cell may be encapsulated between a glass front sheet and a polymer back sheet. The distributed support frame may include a support hub mounted on a back surface of the back sheet, and a support member may extend laterally from the support hub over a back surface of the PV module. For example, the distributed support frame may include several support members radiating from the support hub, and the support members may be symmetrically arranged about a vertical axis passing through the support hub. Accordingly, the distributed support frame may reduce a span length of the PV module between support locations, and thus, may reduce a likelihood that a module laminate will crack under an environmental load.

In an embodiment, the support hub may include a hub connector that can be interlocked with a stand connector of a support stand. Furthermore, the support stand may be mounted on an external structure, e.g., a roof. Thus, the PV panel may be quickly connected to the support stand during installation, and the external structure may transmit an upward reaction force to the PV panel through the support stand to counteract a downward environmental load, e.g., a snow load, placed on the PV module.

Figure 3:
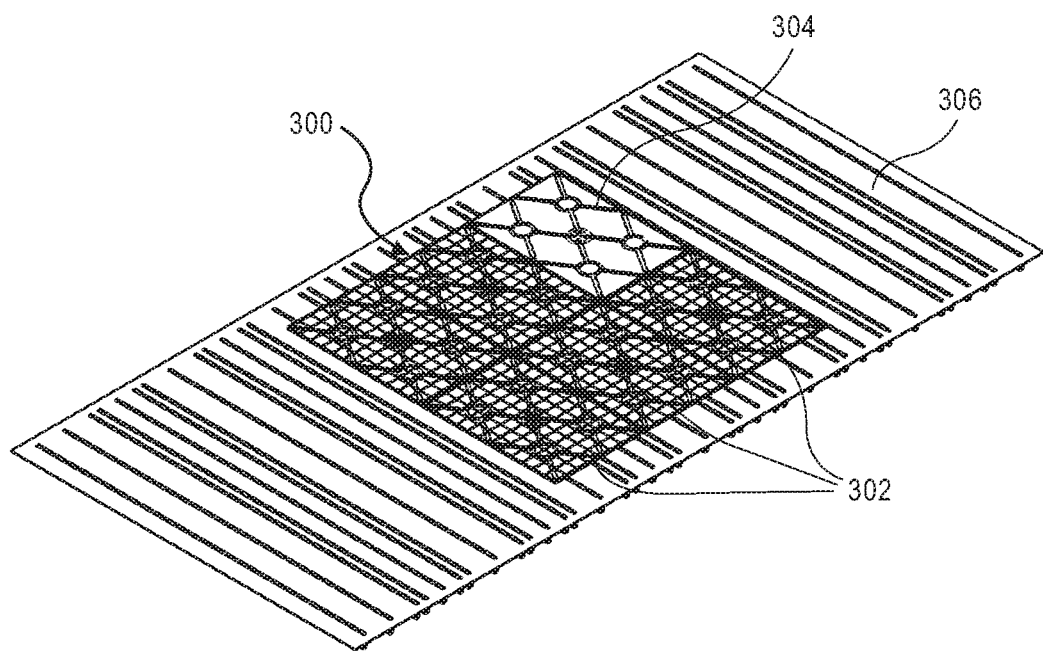
FIG. 3 illustrates a perspective view of a photovoltaic panel having a distributed support frame mounted on an external structure, in accordance with an embodiment of the present disclosure.

Referring to FIG. 3, a perspective view of a photovoltaic panel having a distributed support frame mounted on an external structure is illustrated in accordance with an embodiment of the present disclosure. A PV panel 300 may include one or more PV modules 302 mounted on an underlying distributed support frame 304. More particularly, each PV module 302 may be attached to a respective distributed support frame 304 such that the respective distributed support frame 304 presses upward on an underside of the module. Distributed support frame 304 may be supported in turn by an external structure 306. For example, distributed support frame 304 may be mounted on a rail, beam, and/or roof structure at an installation site. Accordingly, distributed support frame 304 may hold PV module(s) 302 above external structure 306.

Figure 4:
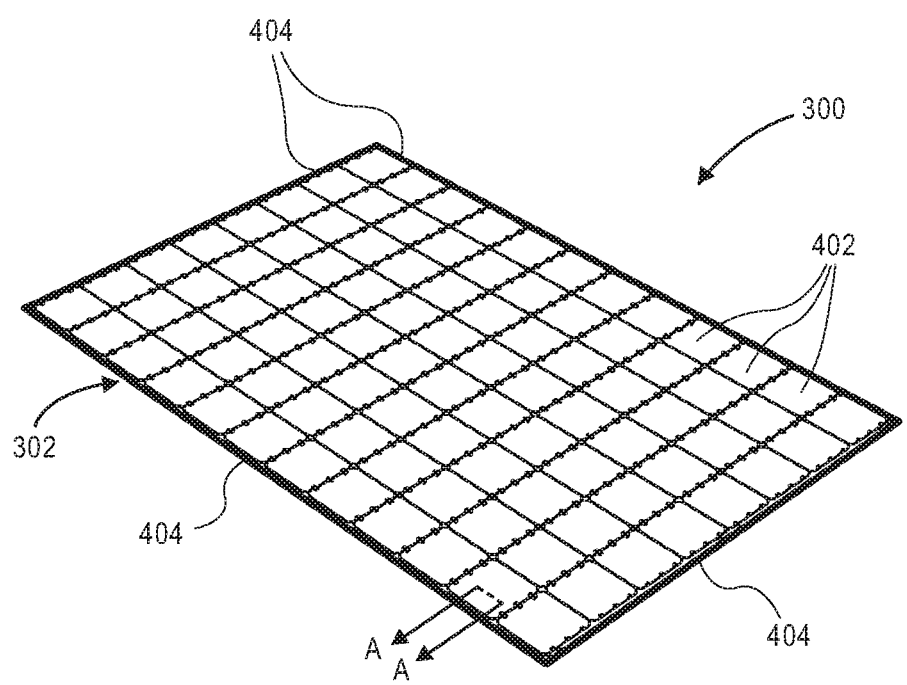
FIG. 4 illustrates a front perspective view of a photovoltaic module supported by a distributed support frame, in accordance with an embodiment of the present disclosure.

Referring to FIG. 4, a front perspective view of a photovoltaic module supported by a distributed support frame is illustrated in accordance with an embodiment of the present disclosure. A representative PV module 302 of PV panel 300 is shown, however, PV panel 300 may include several PV modules 302. Each PV model module may have one or more PV cells 402. For example, PV cells 402 may be arranged in a grid, i.e., several row(s) or columns(s), inward from the outer edges of PV module 302. More particularly, the PV cells 402 may be electrically connected in one or more PV cell strings laterally inward from the outer edges of PV module 302. The outer edges may define a lateral perimeter 404 around PV cells 402 of PV module 302. PV module 302 of PV panel 300 may be held by a distributed support frame 304, which is hidden below the string of PV cells 402.

Figure 5:
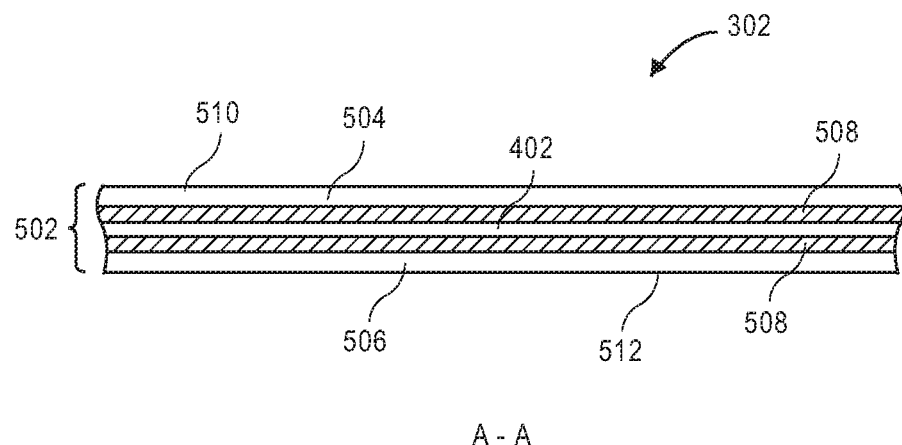
FIG. 5 illustrates a cross-sectional view, taken about line A-A of FIG. 4, of a module laminate, in accordance with an embodiment of the present disclosure.

Referring to FIG. 5, a cross-sectional view, taken about line A-A of FIG. 4, of a module laminate is illustrated in accordance with an embodiment of the present disclosure. PV module 302 may include a module laminate 502. More particularly, module laminate 502 may include a laminated structure that includes several PV cells 402 between a front layer 504 and a back layer 506. For example, PV cell 402 may be encapsulated between front layer 504 and back layer 506, and an encapsulant material 508 may be laminated over PV cell 402 between both front layer 504 and back layer 506. Encapsulant material 508 may have excellent adhesion and light transmission characteristics. For example, encapsulant 508 may include a thermoplastic olefin, e.g., polyethylene. Accordingly, encapsulant 508 may bond PV cell 402 to front layer 504 and back layer 506, and may permit light to transmit through front layer 504 or back layer 506 to be captured by PV cell 402 for energy conversion.

Front layer 504 and back layer 506 may be coextensive along parallel transverse planes. For example, front layer 504 may have a front surface 510 extending transversely between opposite edges of lateral perimeter 404, and back layer 506 may have a back surface 512 extending transversely between the opposite edges of lateral perimeter 404.

In an embodiment, front sheet includes a sheet of transparent material. By way of example, front layer 504 may include a glass sheet. Furthermore, PV cell 402 may include a cell surface facing upward to receive sunlight through front layer 504. Accordingly, sunlight may transmit through front layer 504 to PV cell 402 for energy conversion.

In an embodiment, front layer 504 and back layer 506 are formed from different materials. By way of example, front layer 504 may include a glass sheet and back layer 506 may include a polymer sheet. As such, front layer 504 and back layer 506 may have different elastic moduli. More particularly, front layer 504 may be formed from a first material having a first modulus, and back layer 506 may be formed from a second material having a second modulus. Such a laminate structure may be referred to as an asymmetric laminate structure. In an embodiment, the layers of the asymmetric laminate structure are apt to deflect differently under an external load. For example, the asymmetric laminate structure may distribute stresses disproportionately throughout the laminate cross-section, and thus, the asymmetric laminate structure may flex more under a given load than a typical glass-glass module. Accordingly, the asymmetric laminate structure may benefit from distributed support frame 304 that supports back surface 512 in a distributed fashion between lateral perimeter 404.

Although front layer 504 and back layer 506 may include different elastic moduli, the layers may alternatively include a same elastic modulus. For example, front layer 504 and back layer 506 may be formed of a same material, e.g., glass-glass or polymer-polymer. In the case of PV module 302 having a polymeric front layer 504 and a polymeric back layer 506, PV module 102 may be a flexible panel. PV module 302 may nonetheless be adequately supported by distributed support frame 304 to provide a lightweight and robust PV panel 300.

Figure 6:
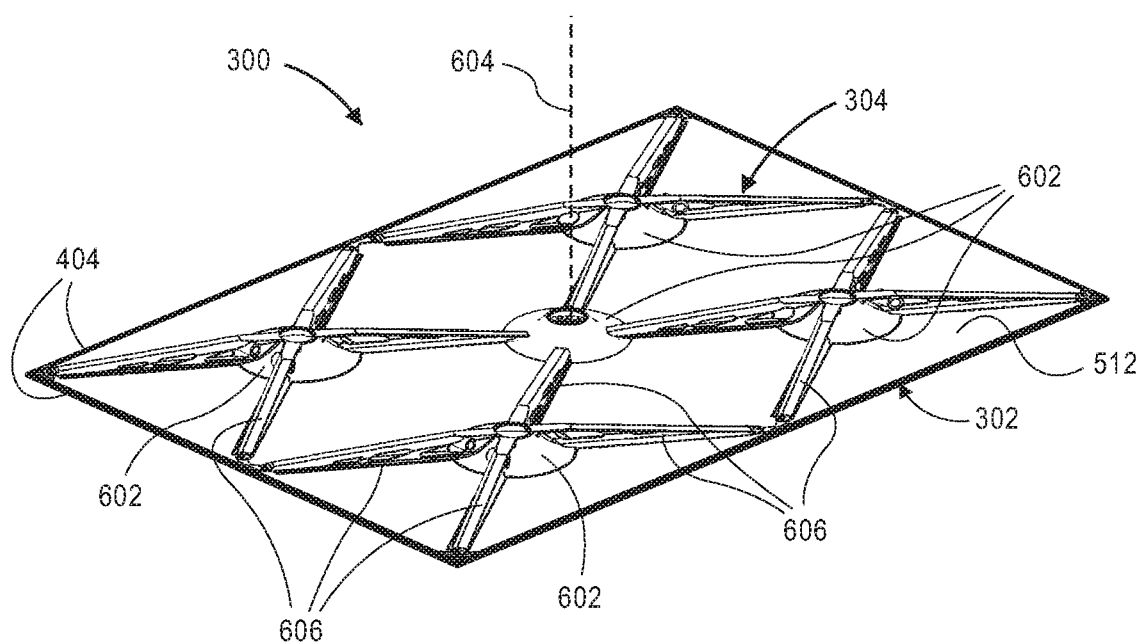
FIG. 6 illustrates a back perspective view of a photovoltaic module supported by a distributed support frame, in accordance with an embodiment of the present disclosure.

Referring to FIG. 6, a back perspective view of a photovoltaic module supported by a distributed support frame is illustrated in accordance with an embodiment of the present disclosure. Distributed support frame 304 of PV panel 300 includes one or more support hub 602 mounted on back surface 512 of PV module 302. As described below, each support hub 602 may be mounted on external structure 306 to transmit a reaction force upward to back surface 512. The support hub(s) 602 may be mounted on back surface 512 inward from lateral perimeter 404. Accordingly, module laminate 502 may be supported nearer to a central vertical axis 604. For example, the control vertical axis 604 may extend through a central support hub 602 orthogonal to back surface 512 at a center of PV module 302. Similarly, each support hub 602 may be arranged along a respective vertical axis 604 along which a reaction force is transmitted from external structure 306 to support hub 602 and PV module 302. Thus, a span section, i.e., an unsupported section of PV module 302, may have a span length between vertical axes 604, and the span length may be reduced as compared to a span length of PV panel 100 shown in FIG. 1. That is, the unsupported sections between support hubs 602 may be smaller than the unsupported sections between outer edge 104.

In an embodiment, distributed support frame 304 includes a support member 606 extending laterally from support hub 602 over back surface 512. More particularly, each support hub 602 on back surface 512 may include at least one support member 606 radiating in a transverse or lateral direction between support hub 602 and lateral perimeter 404. Support member 606 may be a fixed linkage attached to support hub 602, and thus, support hub 602 and support member 606 may act as a unitary supporting structure. For example, support member 606 may act as a cantilever beam extending outward from support hub 602, and thus, the upward force transmitted from external structure 306 to support hub 602 may be transmitted to module laminate 502 by support hub 602 and by support member 606. That is, when PV module 302 flexes under the weight of external loading, it may contact support member 606, and thus, the flexion of module laminate 502 over support hub 602 and support member 606, as well as over the span length between support hubs 602 and support members 606, may be limited.

Several support members 606 may extend laterally from a respective support hub 602. By way of example, the central support hub 602 arranged along vertical axis 604 shown in FIG. 6 may include several support members 606 arranged symmetrically about vertical axis 604. In an embodiment, three support members 606 extend laterally from a support hub 602, and each support member 606 is separated from the other support members 606 by a 120° angle. Similarly, four support members 606 may extend laterally from a support hub 602, and each support member 606 may be separated from another support member 606 by a 90° angle. Of course, more or fewer support members 606 may fan out from support hub 602 in a symmetric or non-symmetric arrangement within the scope of this description.

Figure 7:
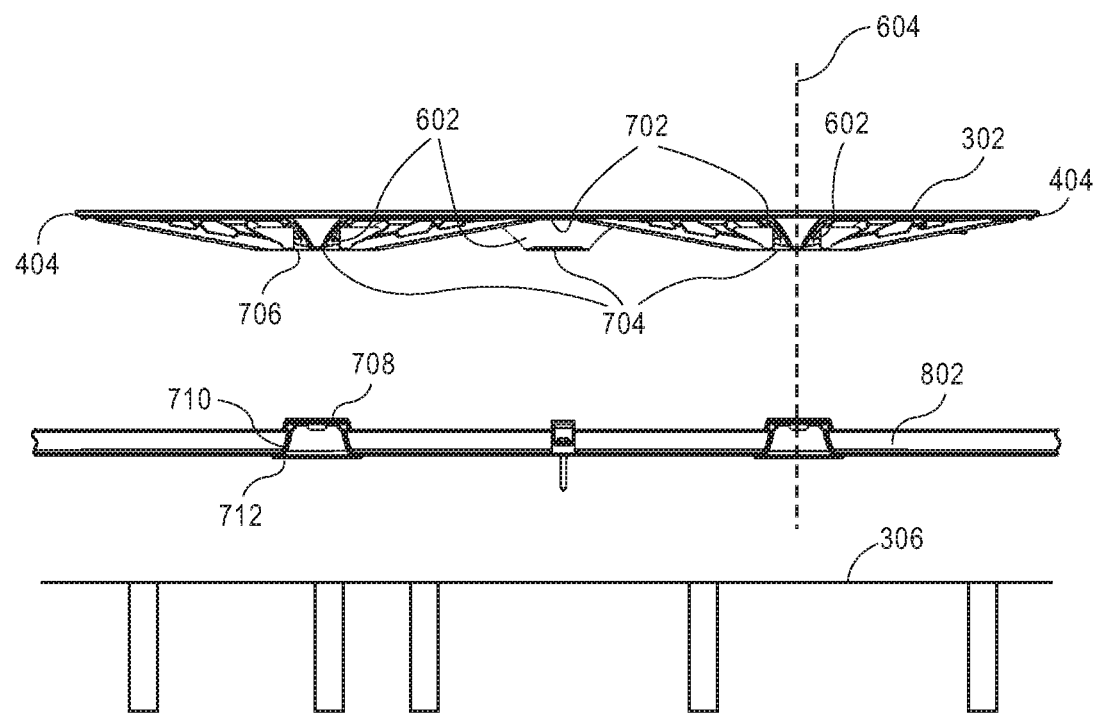
FIG. 7 illustrates an exploded view of a photovoltaic panel, a support stand, and an external structure, in accordance with an embodiment of the present disclosure.

Referring to FIG. 7, an exploded view of a photovoltaic panel, a support stand, and an external structure is illustrated in accordance with an embodiment of the present disclosure. Each support hub 602 may include an upper end 702 mounted on back surface 512 of module laminate 502, e.g., inward from lateral perimeter 404. Furthermore, support hub 602 may extend vertically from upper end 702 to a lower end 704 nearer to a mounting surface. More particularly, lower end 704 may be vertically offset from upper end 702 along vertical axis 604. Accordingly, support hub 602 may hold PV module 302 above the mounting surface to allow air to flow underneath PV module 302, i.e., between PV module 302 and external structure 306, after installation. Such airflow can provide beneficial cooling to PV module 302, even when the vertical offset is as small as 1 cm.

Support hub 602 may include a mechanical coupler to facilitate attachment to external structure 306. More particularly, support hub 602 may include a hub connector 706 at lower end 704. Hub connector 706 may be any of a variety of interlocking mechanisms. For example, hub connector 706 may be a male or female fastener feature to allow hub connector 706 to attach to a mating stand connector 708 of a support stand 710. By way of example, hub connector 706 and stand connector 708 may be mating components of a snap feature. For example, hub connector 706 may include a groove within which a lip of stand connector 708 engages to interlock support stand 710 to support hub 602. Hub connector 706 and stand connector 708 may be embodied by other interlocking mechanisms, however. For example, the connectors may be mating components of a threaded fastener, a hook and groove fastener, a clevis fastener, etc.

In an embodiment, support stand 710 is an intermediary between external structure 306, e.g., a roof, and support hubs 602 of distributed support frame 304. More particularly, an upward reaction force may be transmitted through support stand 710 to support hub 602. Accordingly, support stand 710 may be mounted directly on external structure 306. For example, support stand 710 may include a base 712, e.g., a flange, which may be fastened or attached to external structure 306. Accordingly, stand connector 708 may be coupled to hub connector 706 between upper end 702 of support hub 602 and base 712 of support stand 710. More particularly, stand connector 708 may be coupled to hub connector 706 at a vertical location between PV module 302 and external structure 306.

Figure 8:
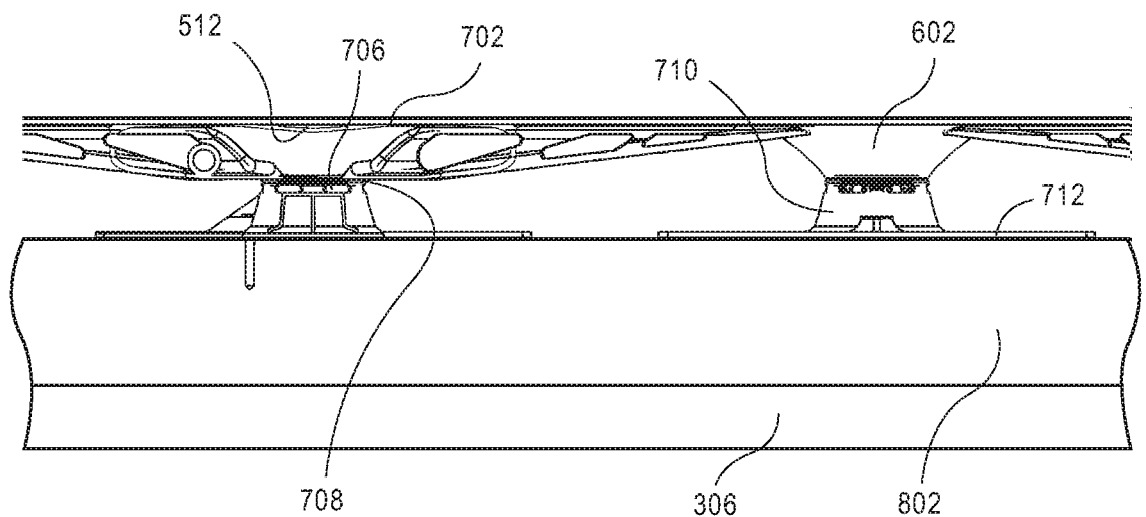
FIG. 8 illustrates a side view of a photovoltaic panel coupled to a support stand mounted on an external structure, in accordance with an embodiment of the present disclosure.

Referring to FIG. 8, a side view of a photovoltaic panel coupled to a support stand mounted on an external structure is illustrated in accordance with an embodiment of the present disclosure. Hub connector 706 may interlock with stand connector 708 form a unitary support by combining support hub 602 and support stand 710. In an embodiment, base 712 of support stand 710 is mounted on a rail 802. Rail 802 may be a cross member used to hold support stand 710. For example, rail 802 may be integral to support stand 710 (FIG. 8), or alternatively, rail 802 may be located below base 712, and between support stand 710 and external structure 306. Thus, support stand 710 may optionally lay on top of rail 802. In an embodiment, however, base 712 of support stand 710 is attached directly to an external structure 306, e.g., roof. In any case, external structure 306 may provide vertically support PV module 302, and the support may be transmitted to PV module 302 through one or more of support stand 710 or support hub 602.

The interlocking mechanism between support hub 602 and support stand 710, i.e., the interlocking operation of hub connector 706 and stand connector 708, may provide a quick-release, two-part attachment to an external structure 306. For example, in the case of a snapping feature used to interconnect hub connector 706 and stand connector 708, support stand 710 may be mounted to rail 802 or external structure 306, and support hub 602 may be quickly connected to support stand 710 by snapping the components into place. Such a quick-connect mechanism advantageously reduces a time required to install PV panel 300 on external structure 306.

Figure 9:
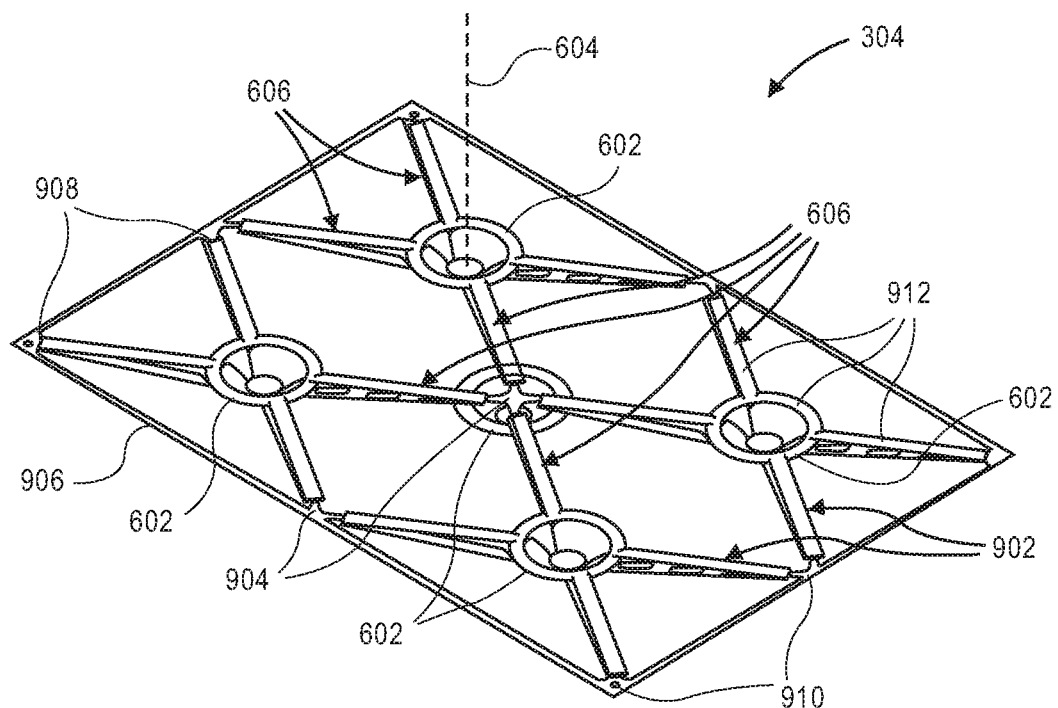
FIG. 9 illustrates a front perspective view of a distributed support frame, in accordance with an embodiment of the present disclosure.

Referring to FIG. 9, a front perspective view of a distributed support frame is illustrated in accordance with an embodiment of the present disclosure. Distributed support frame 304 may include several separate components linked together to form a unitary supporting structure. For example, distributed support frame 304 may include several cross structures 902 joined together by one or more support couplings 904. For example, distributed support frame 304 may include four cross structures 902. Each cross structure 902 may include four support members 606 extending from a respective support hub 602 in a cross-like pattern about a vertical axis 604. Furthermore, at least one of the support members 606 of each cross structure 902 may be joined to a corresponding support member 606 of the other cross structures 902 by a central support coupling 904. Similarly, each cross structure 902 may include a support member 606 joined to a perimeter frame 906 by a lateral support coupling 904. More particularly, support members 606 of distributed support frame 304 may have respective member tips 908, which may be fastened to a corresponding support coupling 904, e.g., by a threaded fastener. Accordingly, distributed support frame 304 may include interconnected support substructures, which are joined together to form a framework to provide localized support of PV module 302 across back surface 512 and at locations distributed inward from lateral perimeter 404 of PV module 302.

When an external load is applied to PV module 302 on distributed support frame 304, the force is distributed across support hubs 602 and support members 606. More particularly, support hub 602 and/or support member 606 may include a support surface 912 facing back surface 512 of PV module 302. For example, support surfaces 912 may include flat surfaces, e.g., rectangular flat areas or annular flat areas, to receive the weight of PV module 302 and distribute the load such that an underside of PV module 302 is not scored by support surfaces 912. That is, the load may be distributed across an upper surface of distributed support frame 304 along back surface 512 of PV module 302. As described below, distributing the load across support surfaces 912 of distributed support frame 304 may reduce localized stress in PV module 302 to reduce the likelihood that PV module 302 will crack under environmental loading.

Figure 10:
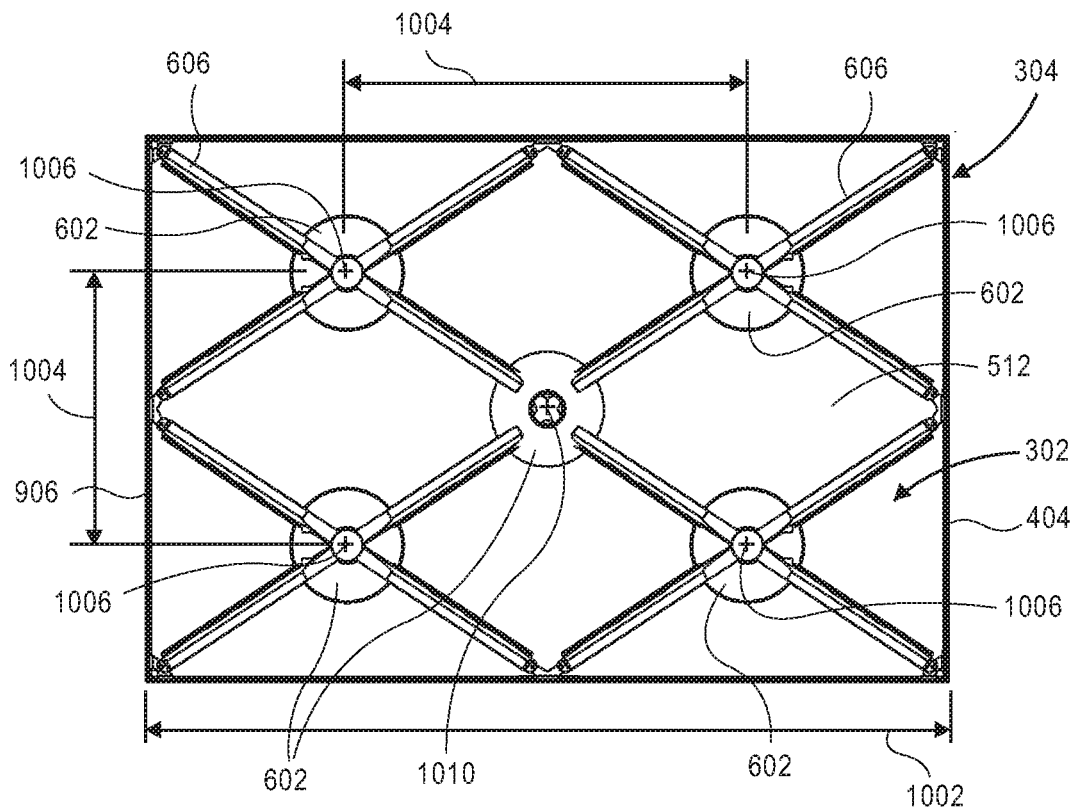
FIG. 10 illustrates a bottom view of a photovoltaic module supported by a distributed support frame, in accordance with an embodiment of the present disclosure.

Referring to FIG. 10, a bottom view of a photovoltaic module supported by a distributed support frame is illustrated in accordance with an embodiment of the present disclosure. Perimeter frame 906 of distributed support frame 304 may have a shape corresponding to PV module 302. For example, PV module 302 may be quadrangular, and thus, perimeter frame 906 may include four corners and four sides matching the rectangular profile of PV module 302. Thus, distributed support frame 304 may include a width equal to a module width 1002 of PV module 302.

In an embodiment, distributed support frame 304 includes several support hubs 602 mounted on back surface 512 inward from lateral perimeter 404. Furthermore, the support hubs 602 may be laterally offset from each other along back surface 512. More particularly, each support hub 602 may be separated from another support hub 602 by a support span 1004. The support span 1004 may be a distance between vertical axes passing through respective support hubs 602. Accordingly, support span 1004 between different pairs of support hubs 602 may be the same or different. That is, a distance separating a first pair of support hubs 602 may be different than a distance separating a second pair of support hubs 602.

Support hubs 602 may be distributed across back surface 512 in a manner that evenly distributes external loading from PV module 302. For example, the support hubs 602 of distributed support frame 304 may be mounted at respective quarter-points 1006 of back surface 512. A quarter-point 1006 may be defined as a center of a quadrant of back surface 512. More particularly, quarter-point 1006 may be separated from a first edge of lateral perimeter 404 (shown vertically in FIG. 10) by a distance equal to module width 1002 divided by four. Similarly, quarter-point 1006 may be separated from a second edge of lateral perimeter 404 (shown horizontally in FIG. 10) by a distance equal to a module height (orthogonal to module width 1002) divided by four. Accordingly, support span 1004 may be half of module width 1002 and/or module height. Distributed support frame 304 may also include a support hub 602 located at a center of back surface 512, i.e., at a half-point 1010 of back surface 512. It will be appreciated that the description of quarter-points 1006 and half-point 1010 is offered by way of example, and that support hubs 602 may be mounted at any location on back surface 512 depending on cost and environmental load considerations. Thus, a load from PV module 302 may be distributed near several point loads at support hubs 602, and across several support members 606 connected to support hubs 602.

PV module 302 and distributed support frame 304 have been illustrated and discussed as being rectangular and/or quadrangular. It will be appreciated, however, that PV module 302 and distributed support frame 304 may have any shape. For example, the components of PV panel 300 may include perimeter frame 906 and/or lateral perimeter 404 having a circular, triangular, pentagonal, etc. profile.

Figure 11:
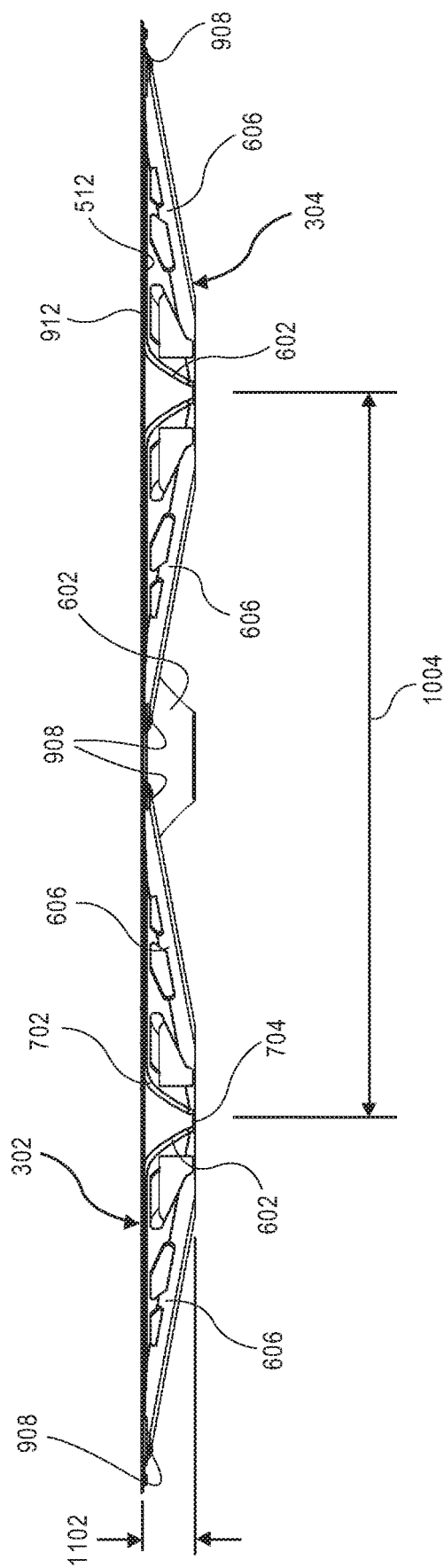
FIG. 11 illustrates a side view of a photovoltaic module supported by a distributed support frame, in accordance with an embodiment of the present disclosure.

Referring to FIG. 11, a side view of a photovoltaic module supported by a distributed support frame is illustrated in accordance with an embodiment of the present disclosure. Laterally extending support members 606 of distributed support frame 304 may include a member height 1102, i.e., a vertical distance between upper end 702 and lower end 704, as discussed above. In an embodiment, member height 1102 tapers in a lateral direction from support hub 602 to member tip 908. For example, member height 1102 of support member 606 may be greater at support hub 602 than member height 1102 of support member 606 at member tip 908. The tapered profile of support member 606 may make an underside of PV module 302 more readily accessible from a side of PV panel 300, i.e., through a gap between PV module 302 and external structure 306. The readily accessible gap may allow for insertion of and/or access to electronic circuitry mounted on an underside of PV module 302, e.g., a microinverter (not shown).

Distributed support frame 304, and the readily accessible gap between PV module 302 and external structure 306, may create an additional benefit of increasing heat dissipation and/or heat transfer away from PV module 302 for increased cooling, as compared to conventional support frames. For example, the increase surface contact between distributed support frame 304 and PV module 302 may increase conductive heat transfer away from the PV cells of PV module 302. Furthermore, the readily accessible gap may allow for increased air flow beneath PV module 302 to convectively cool the members of distributed support frame 304. Thus, in addition to provided improved mechanical support of PV module 302, distributed support frame 304 may act as a heat sink to improve heat transfer away from PV module 302 and to lower an operating temperature of PV module 302.

Distributed support frame 304 components may be fabricated from a variety of materials. For example, support hubs 602 and/or support members 606 may be either plastic or metal. It may be advantageous to fabricate distributed support frame 304 from plastic because distributed support frame 304 would then weigh less, e.g., as compared to the aluminum support frame 102 shown in FIG. 1. In an embodiment, distributed support frame 304 is fabricated from a plastic having a strength at least as high as a low strength polypropylene, e.g., high density polyethylene. It will be appreciated that a plastic distributed support frame 304 may not fail under an external load while support frame 102, if it were fabricated from plastic, may. The plastic distributed support frame 304 may not fail because distributed support frame 304 spreads a load across a larger surface area than support frame 102, and thus, localized stress on distributed support frame 304 components may be comparatively less than localized stress on support frame 102 components. Distributed support frame 304, however, may be formed from any material, including metal or a composite material, such as a carbon fiber composite.

In an embodiment, fabricating distributed support frame 304 from a lightweight insulating material may enhance safety of the system. For example, the given that the environmental load may be distributed across the frame system as described above, an insulating material, e.g., a polymer or glass material, having a relatively low material strength may be used to fabricate distributed support frame 304. The insulating material may avoid a need to ground the distributed support frame, since the frame will not carry a charge that can shock an installer or technician working on the PV system. Accordingly, distributed support frame 304 fabricated from an insulating material may reduce a likelihood of electrical shock.

An upper surface of support members 606 is shown immediately adjacent to PV module 302. More particularly, back surface 512 of PV module 302 is shown in contact with support surface 912 of support members 606. In an embodiment, however, back surface 512 of PV module 302 is separated from support surface 912 of support members 606 by a no-load gap (not shown). The no-load gap may be defined as a gap or void between back surface 512 and support surface 912 when no external loading is applied to PV module 302. More particularly, the no-load gap may be a distance between support surface 912 and back surface 512 when PV module 302 is supported by support hubs 602 under no environmental load. The no-load gap may be less than a maximum deflection of PV module 302 when a design load presses on front layer 504. For example, PV module 302 may be designed to deflect by less than 10 mm, e.g., 5 mm, over support span 1004 of distributed support frame 304 when an external load of 6000 Pascal is applied to front layer 504. Accordingly, no-load gap may be less than 5 mm, e.g., 3 mm, to allow PV module 302 to be suspended between support hubs 602 when no external load is applied, and then to flex into contact with support members 606 when an external load is applied. Similarly, support span 1004 may be a predetermined distance to limit the flexion of PV module 302 to less than predetermined deflection, e.g., less than 10 mm, when the design load presses on front layer 504. Thus, PV module 302 may be supported only by support hubs 602 inward from lateral perimeter 404 when no external load is applied, and PV module 302 may be supported by both support hubs 602 and support members 606 over a comparatively larger distributed surface area when an external load is applied. Furthermore, the deflection of PV module 302, both at the locations above distributed support frame 304, and within support span 1004 between distributed support frame 304 components, may be less than the predetermined maximum deflection.

Figure 12:
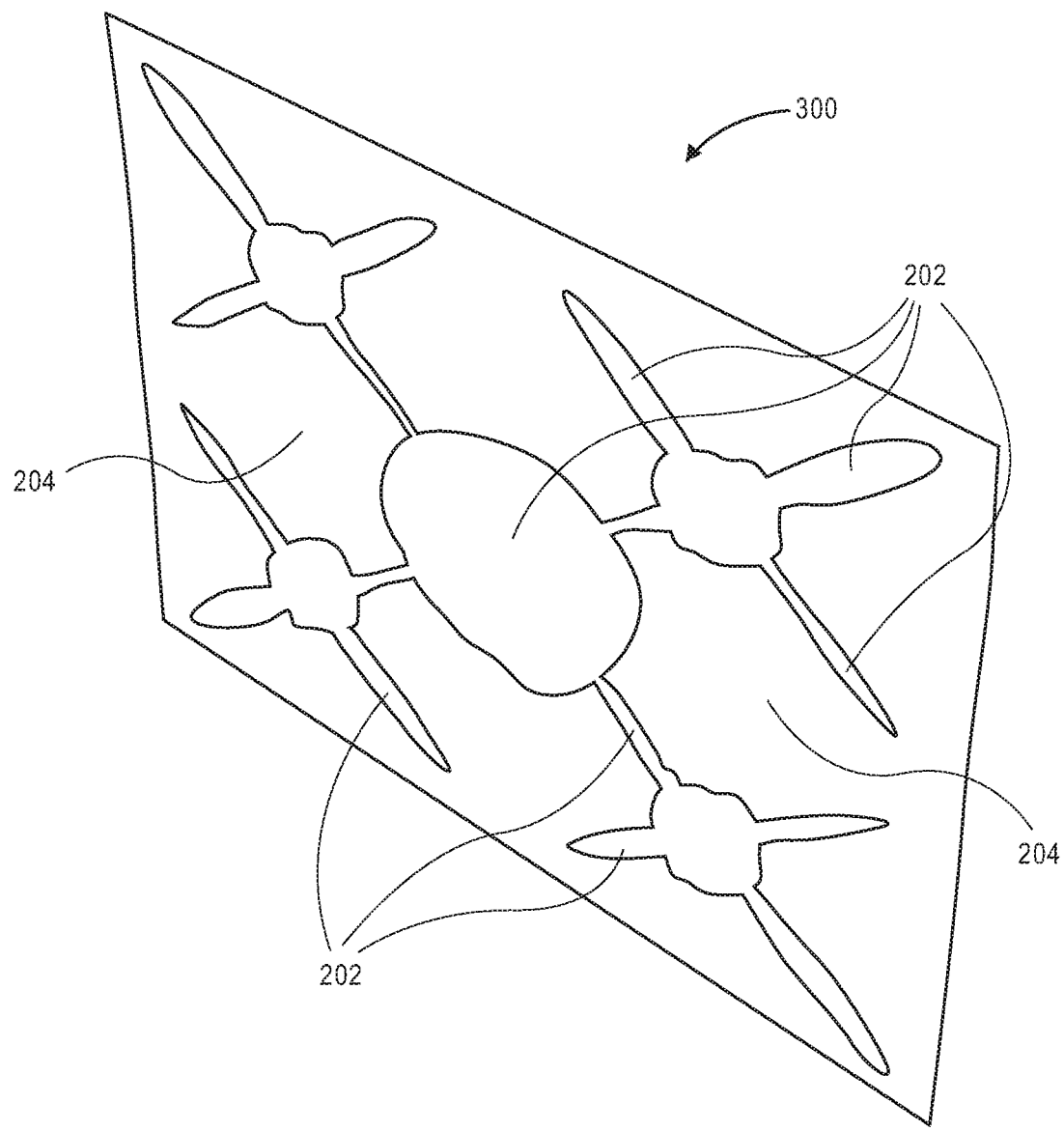
FIG. 12 illustrates a deflection distribution of a photovoltaic panel having a photovoltaic module supported by a distributed support frame, in accordance with an embodiment of the present disclosure.

Referring to FIG. 12, a deflection distribution of a photovoltaic panel having a photovoltaic module supported by a distributed support frame is illustrated in accordance with an embodiment of the present disclosure. Distributed support frame 304 of PV panel 300 may be designed to limit a deflection of PV module 302. More particularly, support hubs 602 and support members 606 may be distributed across back surface 512 of PV module 302 to provide a maximum support span 1004, i.e., a maximum distance between any two locations at which PV module 302 is supported, to maintain the deflection of PV module 302 within a predetermined range. In an embodiment, PV module 302 may have support deflection 202 within the regions over distributed support frame 304. That is, the deflection of PV module 302 over support members 606 may be well within a maximum deflection permitted before PV module 302 fails by cracking. PV module 302 may have a design deflection 204 within regions laterally spaced apart from distributed support frame 304. For example, a location at a middle of support span 1004, i.e., halfway between a pair of support members 606 and/or a pair of support hubs 602, may deflect by a predetermined amount when a design load, e.g., a 6000 Pascal snow load, is applied to PV module 302. Accordingly, a maximum amount of deflection experienced by PV panel 300 may be less than a maximum amount of deflection experienced by PV panel 100 under identical external loading. As such, distributed support frame 304 may impart an anti-cracking characteristic to PV panel 300 by limiting deflection of PV module 302 under environmental loading. Thus, PV module 302 may be thinned without a risk of failure in the field. For example, PV panel 300 shown in FIG. 12 may have a front layer 504 including a 2.0 mm thick glass sheet, and PV panel 100 shown in FIG. 1 may have a 3.2 mm thick front glass sheet. Despite being comparatively thicker, PV panel 100 may experience greater deflection under a given load than PV panel 300, and thus, PV panel 300 may be less likely to crack under the given load than PV panel 100. It will be appreciated that thinning the glass sheet of PV panel 300 may also provide a benefit of reduced panel weight, which may translate to reduced manufacturing and shipping costs, and an improvement to ease of installation.

Figure 13:
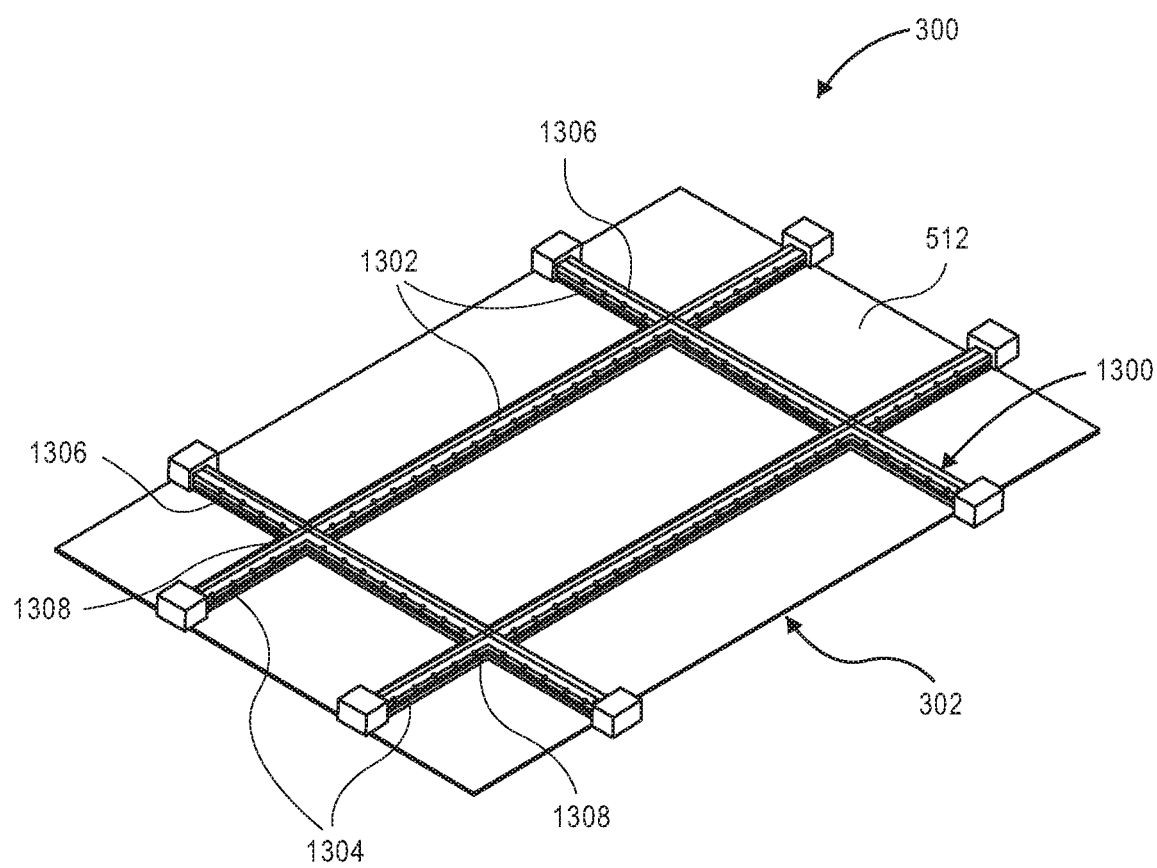
FIG. 13 illustrates a back perspective view of a photovoltaic module supported by a distributed rail frame, in accordance with an embodiment of the present disclosure.

Referring to FIG. 13, a back perspective view of a photovoltaic module supported by a distributed rail frame is shown in accordance with an embodiment of the present disclosure. PV panel 300 may include a distributed rail frame 1300 mounted on back surface 512 of PV module 302. Distributed rail frame 1300 may be an embodiment of a distributed support frame 304, having several elongated rails 1302 extending across back surface 512 to support an environmental load applied to PV module 302. Elongated rails 1302 are analogous to support member 606 described above, and may be distributed in a similar manner to achieve a same effect. For example, distributed rail frame 1300 may include at least one x-axis rail 1304 and at least one y-axis rail 1306 extending in orthogonal directions across back surface 512 inward from lateral perimeter 404. The transversely extending rails may cross at one or more rail intersections 1308, which are analogous to support hubs 602 described above. Rail intersections 1308 may thus be distributed in a similar manner to achieve a same effect.

Although not shown, distributed rail frame 1300 may be mounted on external structure 306 using one or more support stand 710. For example, a support stand 710 may be attached to a corresponding connector at rail intersection 1308 to provide vertical support to distributed rail frame 1300 at an interconnection point 1308. Support stand(s) 710 may also be mounted along a length of an x-axis rail 1304 or a y-axis rail 1306 to support a weight of PV module 302 along the rail length.

X-axis rail(s) 1304 and y-axis rails 1306 may include rails of various materials and shapes. For example, the rails may be extruded aluminum rails, e.g., T-slotted aluminum rails, having lengths along a rail axis at least five times a width or height of a rectangular cross-section about the rail axis. Similarly, the elongated rails may be joined at rail intersection(s) 1308 in a variety of manners, including by mechanical fasteners or thermal welding. Although the rails of distributed rail frame 1300 are shown as being within a same transverse plane and as having a same number of x-axis rails 1304 and y-axis rails 1306, other embodiments may differ. For example, distributed rail frame 1300 may include more x-axis rails 1304 than y-axis rails 1306, and the x-axis rails 1304 may be separated by a predetermined span length to limit deflection of PV module 302. Y-axis rails 1306 may function primarily to support the closely-spaced x-axis rails 1304, and thus, there may be fewer y-axis rails 1306 separated from each other by a larger distance than the span length.

A PV panel having a PV module supported by a distributed support frame is described. Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A photovoltaic panel, comprising:
   a photovoltaic module having a photovoltaic cell between a front layer and a back layer, wherein the back layer includes a back surface sheet defining an outer photovoltaic module perimeter; and
   a distributed support frame including
      a plurality of support hubs mounted on the back surface sheet of the photovoltaic module, wherein at least two support hubs of the plurality include a plurality of support members extending outwardly from its respective support hub and towards the outer photovoltaic module perimeter, wherein at least two support members for each respective support hub are not parallel to each other.

2. The photovoltaic panel of claim 1, wherein each support hub of the plurality of support hubs includes an upper end mounted on the back surface sheet and located inside of the photovoltaic module perimeter, and a hub connector at a lower end, and further comprising a support stand having a stand connector coupled to at least one hub connector of the distributed support frame between the upper end of the support hub and a base of the support stand.

3. The photovoltaic panel of claim 1, wherein the distributed support frame forms the shape of diamonds and triangles defined by support members and support hubs.

4. The photovoltaic panel of claim 3, wherein each support hub is in the shape of a truncated cone.

5. The photovoltaic panel of claim 3, wherein each support member includes a support surface facing the back surface sheet, and wherein the support surface contacts the back surface sheet when a design load presses on the front layer.

6. The photovoltaic panel of claim 5, wherein each support surface is separated from the back surface sheet by a no-load gap, and wherein the no-load gap is less than a maximum deflection of the photovoltaic module when the design load presses on the front layer.

7. The photovoltaic panel of claim 3, wherein each of the support members include a member height tapering from the respective support hub to a respective member tip, and further comprising a support coupling coupled to the member tips of the support members.

8. The photovoltaic panel of claim 1, wherein the front layer and the back layer have different elastic moduli.

9. The photovoltaic panel of claim 8, wherein the front layer includes a glass sheet, and wherein the back layer includes a polymer sheet.

10. The photovoltaic panel of claim 1, wherein the plurality of support members is symmetrically arranged about a vertical axis extending through a center support hub, the vertical axis orthogonal to the back surface sheet.

11. A photovoltaic panel, comprising:
    a photovoltaic module having a photovoltaic cell between an upper layer and a back layer, wherein the back layer includes a back surface, wherein the upper layer extends to and defines a first outer photovoltaic module perimeter; and
    a distributed support frame including
       a plurality of support hubs, at least two hubs of the plurality having a first end mounted on the back surface and within the first outer photovoltaic module perimeter, wherein at least two hubs of the plurality include a hub connector at a second end, and
       a plurality of support member extending outwardly from each support hub, each support member of the plurality of support members positioned within the first outer photovoltaic module perimeter.

12. The photovoltaic panel of claim 11 further comprising a support stand having a stand connector coupled to at least one hub connector.

13. The photovoltaic panel of claim 11, wherein the upper layer and the back layer have different elastic moduli.

14. The photovoltaic panel of claim 13, wherein the upper layer includes a glass sheet, and wherein the back layer includes a polymer sheet.

15. The photovoltaic panel of claim 11, wherein the plurality hubs include a central support hub and satellite support hubs, the central support hub located in the center of the back layer and the satellite support hubs radially located outwardly from the central support hub.

16. The photovoltaic panel of claim 1 wherein support members extends radially outwardly from their respective support hub and towards the perimeter and wherein the back layer includes a single continuous back surface defining the perimeter.

17. The photovoltaic panel of claim 1 wherein the plurality of support hubs includes a central support hub and satellite support hubs, the satellite support hubs positioned closer to the perimeter than the central support hub.

18. The photovoltaic panel of claim 17
    wherein at least one support member for each support hub of the plurality has a first end and a second end and has a taper located along the length of support member between the first end and the second end and tapering from the first end to the second end,
    wherein the central support hub is connected to the second end of a support member of the plurality of support members, and
    wherein each satellite support hub is connected to a first end of a support member of the plurality of support members.

19. A system of photovoltaic panels comprising:
    a first photovoltaic panel comprising a first outer perimeter, a plurality of support hubs located within the first outer panel perimeter, at least two of the support hubs located within the first outer perimeter coupled to a plurality of support frames that extend outwardly from each of the at least two support hubs, the first outer panel perimeter bordering a single glass sheet of the first photovoltaic panel;
    a second photovoltaic panel comprising a second outer panel perimeter, a plurality of support hubs located within the second outer perimeter, at least two of the support hubs located within the second outer perimeter coupled to a plurality of support frames that extend outwardly from each of the at least two support hubs, the second panel perimeter bordering a single glass sheet of the second photovoltaic panel;
    a first stand connector positioned within the first outer panel perimeter and coupled to a base; and
    a second stand connector positioned within the second outer panel perimeter and coupled to the base.

20. The system of photovoltaic panels of claim 19
    wherein the plurality of support hubs of the first photovoltaic panel comprises a central support hub and at least one satellite support hub, the central support hub and the satellite support hub each located within the first outer panel perimeter, and
    wherein, the plurality of support hubs of the second photovoltaic panel comprises a central support hub and at least one satellite support hub, the central support hub and the satellite support hub each located within the second outer panel perimeter.

* * * * *